United States Patent
Maekawa et al.

[11] Patent Number: 5,841,064
[45] Date of Patent: Nov. 24, 1998

[54] PELTIER MODULE

[75] Inventors: Nobuteru Maekawa, Katano; Katsuyoshi Shimoda, Hikone; Teruaki Komatsu, Hikone; Shinya Murase, Hikone; Hiroaki Okada, Ikoma-gun; Hiroyuki Inoue, Hikone, all of Japan

[73] Assignee: Matsushita Electric Works, Ltd., Osaka, Japan

[21] Appl. No.: 776,186
[22] PCT Filed: May 27, 1996
[86] PCT No.: PCT/JP96/01421
§ 371 Date: Jan. 24, 1997
§ 102(e) Date: Jan. 24, 1997
[87] PCT Pub. No.: WO96/37918
PCT Pub. Date: Nov. 28, 1996

[30] Foreign Application Priority Data

May 26, 1995 [JP] Japan ..................... 7-128693

[51] Int. Cl.⁶ ............... H01L 35/02; H01L 35/08
[52] U.S. Cl. ............ 136/203; 136/224; 136/225; 136/230; 136/237; 62/3.2
[58] Field of Search ................. 136/203, 204, 136/224, 225, 230, 236.1, 237; 62/3.2

[56] References Cited

U.S. PATENT DOCUMENTS

| | | | |
|---|---|---|---|
| 2,289,152 | 7/1942 | Telkes | 62/3.2 |
| 3,040,539 | 6/1962 | Gaugler | 136/225 |
| 3,090,206 | 5/1963 | Anders | 136/225 |
| 3,208,877 | 9/1965 | Merry | 62/3.2 |
| 3,225,549 | 12/1965 | Elfving | 136/204 |
| 3,240,628 | 3/1966 | Sonntag, Jr. | 136/203 |
| 3,261,079 | 7/1966 | Clingman, Jr. et al. | 136/224 |
| 3,266,944 | 8/1966 | Spira et al. | 136/230 |
| 3,279,955 | 10/1966 | Miller et al. | 136/230 |
| 3,325,312 | 6/1967 | Sonntag, Jr. | 136/230 |
| 3,339,002 | 8/1967 | Pelanne | 136/224 |
| 3,411,955 | 11/1968 | Weiss | 136/230 |
| 4,149,025 | 4/1979 | Niculescu | 136/206 |
| 4,493,939 | 1/1985 | Blaske et al. | 136/212 |
| 5,409,547 | 4/1995 | Watanabe et al. | 136/204 |

FOREIGN PATENT DOCUMENTS

| | | |
|---|---|---|
| 37-11170 | 5/1962 | Japan . |
| 38-8716 | 5/1963 | Japan . |
| 41-4516 | 3/1966 | Japan . |
| 49-12708 | 3/1974 | Japan . |
| 62-158850 | 10/1987 | Japan . |
| 2139976 | 5/1990 | Japan . |
| 2-83446 | 6/1990 | Japan . |
| 4123475 | 4/1992 | Japan . |
| 6174329 | 6/1994 | Japan . |
| 6294562 | 10/1994 | Japan . |

OTHER PUBLICATIONS

English Language Abstract of JP–6–294562; Oct. 21, 1994.
English Language Abstract of JP–4–123475; Apr. 23, 1992.
English Language Abstract of JP–2–139976; May 29, 1990.

Primary Examiner—Kathryn L. Gorgos
Assistant Examiner—Chrisman D. Carroll
Attorney, Agent, or Firm—Greenblum & Bernstein, P.L.C.

[57] ABSTRACT

A Peltier effect module comprising a plurality of Peltier effect elements arranged in parallel between a pair of substrates where the Peltier effect elements are connected to connection electrodes disposed on the substrates. The array of Peltier effect elements is sealed off by a hollow seal frame surrounding the Peltier effect element array with a seal formed by a bond between both end edges of the seal frame and the substrates. Because the perimeter around the Peltier effect elements is sealed using a seal frame metalically bonded at both ends to the substrates, resistance to moisture penetration is largely determined by the material from which the seal frame is made. Therefore, by appropriately selecting the seal frame materials, the Peltier effect module can be reliably protected for a long period of time against moisture penetration.

15 Claims, 13 Drawing Sheets

PELTIER MODULE

This is a national stage application of PCT/JP96/01421, filed May 27, 1996.

FIELD OF THE INVENTION

The present invention relates to a Peltier effect module having a plurality of Peltier effect elements.

DESCRIPTION OF THE PRIOR ART

A conventional Peltier effect module has a parallel arrangement of plural Peltier effect elements, which are thermoelectric conversion elements, between a pair of substrates. The Peltier effect elements are connected to the connection electrodes disposed on the substrates so as to connect said the elements electrically in series and thermally in parallel. The perimeter around the Peltier effect elements between the substrates is sealed to achieve a moisture-resistant module construction and prevent deterioration of the Peltier effect elements as a result of humidity. This seal may be formed by filling said perimeter area with a butyl rubber, silicon rubber, or other sealant as described in Japanese Laid-Open Patent Publication 6-174329, by enclosing the Peltier effect module in a sealed bag as described in Japanese Laid-Open Patent Publication 6-294562, or by forming a seal wall by filling said perimeter area with a plastic adhesive as described in Japanese Laid-Open Patent Publication 2-83446.

A problem with such Peltier effect modules in which a seal is formed from butyl rubber or silicon rubber, or a seal wall is formed by filling the gap between the substrates with an adhesive, is that water vapor is able to penetrate the module from the gap between the twisted wire and plastic sheathing used in the lead wires. The adhesive strength of the adhesive material also deteriorates with age, forming a gap between the adhesive body and the substrate through which moisture vapor can penetrate the module. Over the long term, these configurations thus permit the penetration of moisture vapor, which corrodes the Peltier effect module components and leads to electrical shortcircuit.

Preventing a drop in thermal conductivity is also a problem in Peltier effect modules that use an adhesive.

Another problem with Peltier effect modules encased in a sealed bag is poor thermal performance. More specifically, even if the material used for the bag enclosure has high thermal conductivity, the use of the bag itself greatly reduces the overall thermal conductivity of the module, resulting in poor thermal performance.

DISCLOSURE OF THE INVENTION

An object of the present invention is therefore to provide a Peltier effect module achieving improved moisture resistance without reducing thermal performance or assembly characteristics.

To achieve the above object, a Peltier effect module comprising a parallel arrangement of plural Peltier effect elements between a pair of substrates with said Peltier effect elements connected to connection electrodes disposed on the substrates is characterized according to the present invention by a hollow seal frame surrounding the Peltier effect element array section with a seal formed by a bond between both end edges of the seal frame and the substrates.

A power supply lead electrode formed in a closed loop enclosing the connection electrode group may be further provided on each substrate with both open ends of the seal frame connected to said power supply lead.

The hollow seal frame may be made from a variety of constructions, including a plastic member with a metal coating formed at the connection with the power supply lead, a drawn stainless steel plate with a metal coating formed at the connection with the power supply lead, or a paper member treated with a waterproofing process.

A terminal block for connection with external leads is preferably disposed as part of the power supply lead externally to the seal frame on the substrates.

The substrates are preferably made from a shaped aluminum member treated with an alumina or silicon dioxide layer. The connection electrodes and power supply lead are preferably made using a flame spray method. The pair of substrates may be further supported outside the seal frame by plural support pillars.

Because the perimeter area around the Peltier effect elements between the substrates is not sealed with a sealant or adhesive filler but rather by using a hollow seal frame bonded at both ends thereof to the substrates, the ability to prevent the penetration of water moisture is substantially determined by the material from which the seal frame is manufactured. It is therefore possible to reliably prevent the penetration of moisture to the Peltier effect module over the long term by appropriately selecting the seal frame material.

When a power supply lead electrode, formed in a closed loop enclosing the connection electrode group, is provided on each substrate with both open ends of the seal frame connected to said power supply lead, the use of adhesives with their incumbent moisture prevention problems can be eliminated.

Seal frame manufacture is also simplified when the seal frame is made from a plastic member with a metallic coating formed at the connection with the power supply lead. Module strength can be similarly greatly improved when the seal frame is made from a drawn stainless steel plate with a metallic coating formed at the connection with the power supply lead. Alternatively, the seal frame can also be manufactured easily and at a low cost when it is made from a paper member treated with a waterproofing process.

When the Peltier effect module comprises an externally exposed terminal, the area from which the terminals are exposed can also be prevented from reducing moisture resistance by providing on the substrate externally to the seal frame a terminal block for connection with external leads as part of the power supply lead.

When the substrates are made from a shaped aluminum member treated with an alumina or silicon dioxide coating, and the connection electrodes and power supply lead are made with a flame spray method, substrates with the appropriate characteristics can be easily obtained. Mechanical strength can also be greatly improved if the pair of substrates are further supported outside the seal frame by plural support pillars.

It should be noted that while a metallic bonding method is considered to be the most effective method of fastening the seal frame, flowing an adhesive around the outside circumference of the bonded seal frame can be used to further improve the reliability of the seal.

BRIEF DESCRIPTION OF THE DRAWINGS

FIG. 12A is a side view.

FIG. 14A is a plan view.

BEST MODE FOR CARRYING OUT THE INVENTION

Figure 1:
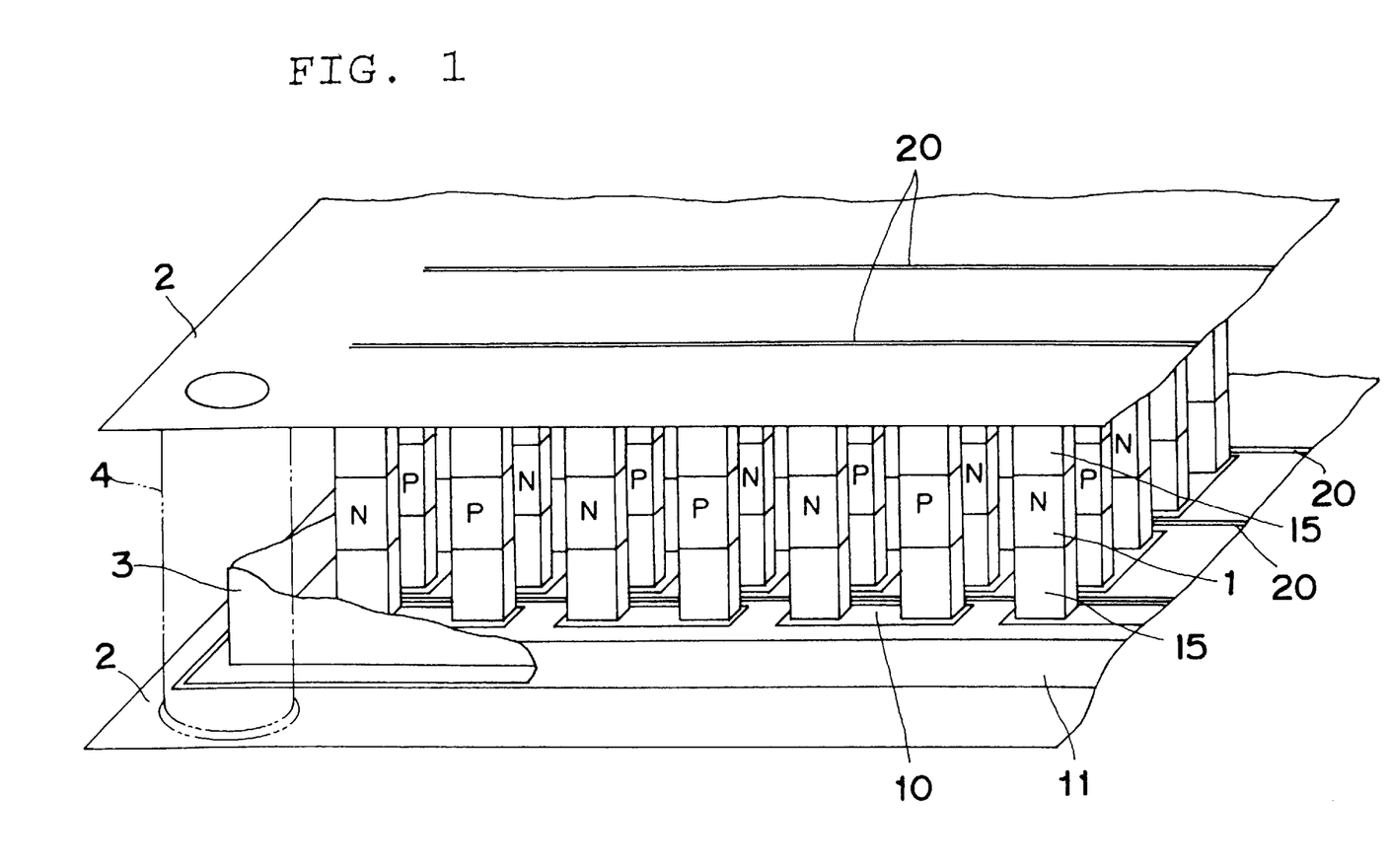
FIG. 1 is a perspective cut-away view of a Peltier effect module according to a preferred embodiment of the present invention.
Figure 2:
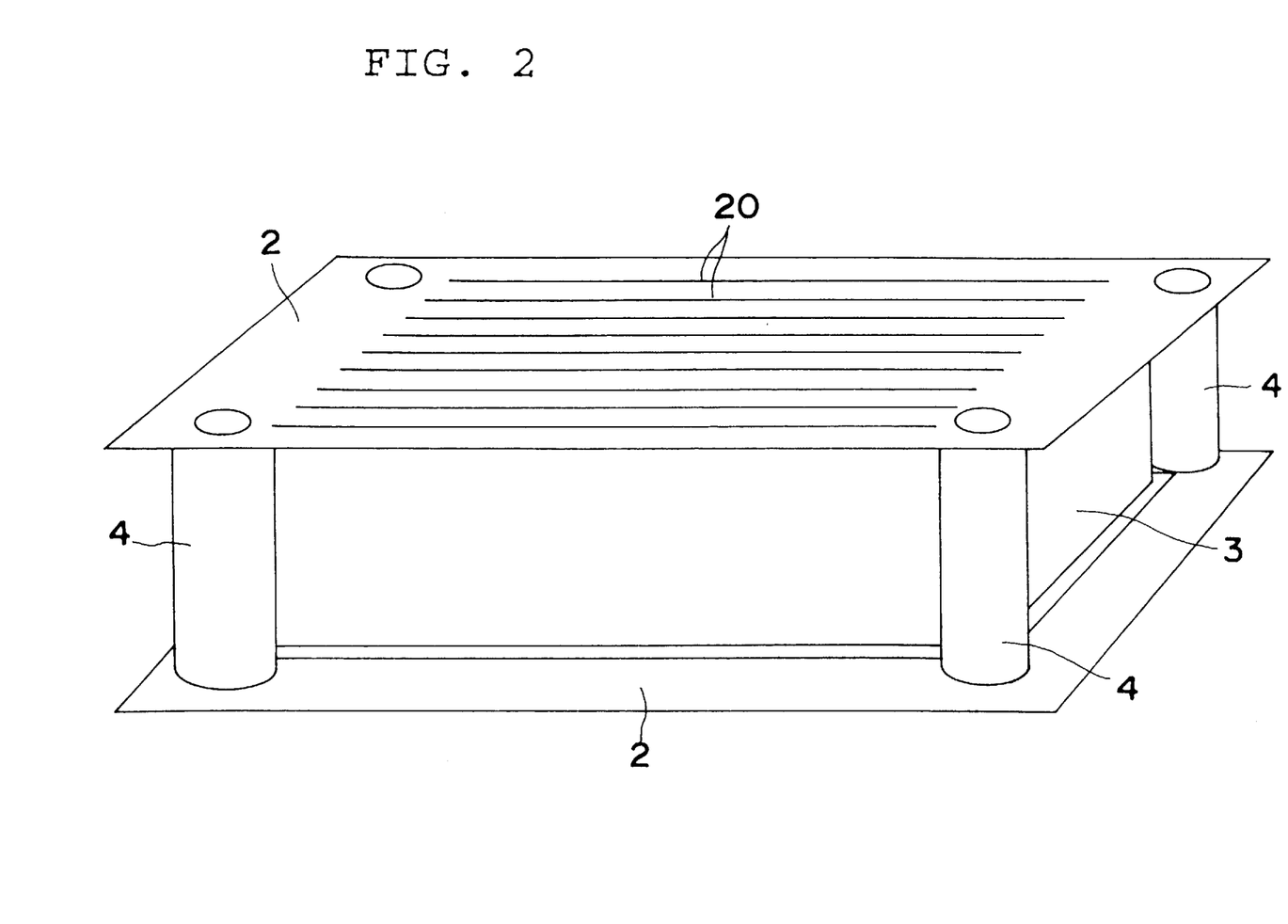
FIG. 2 is a perspective exterior view of the Peltier effect module according to the preferred embodiment of the present invention.
Figure 3:
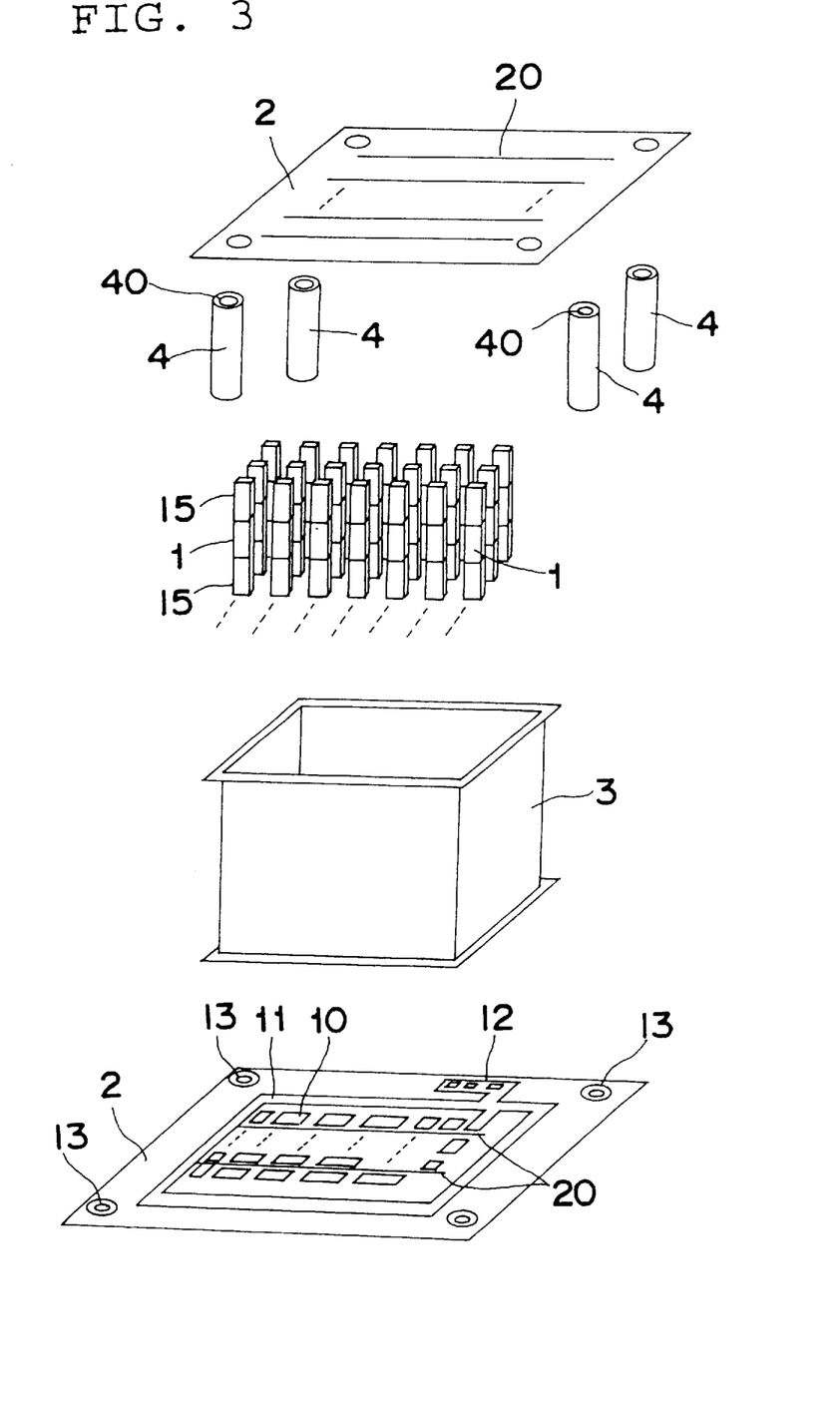
FIG. 3 is an exploded view of the Peltier effect module according to the preferred embodiment of the present invention.
Figure 4:
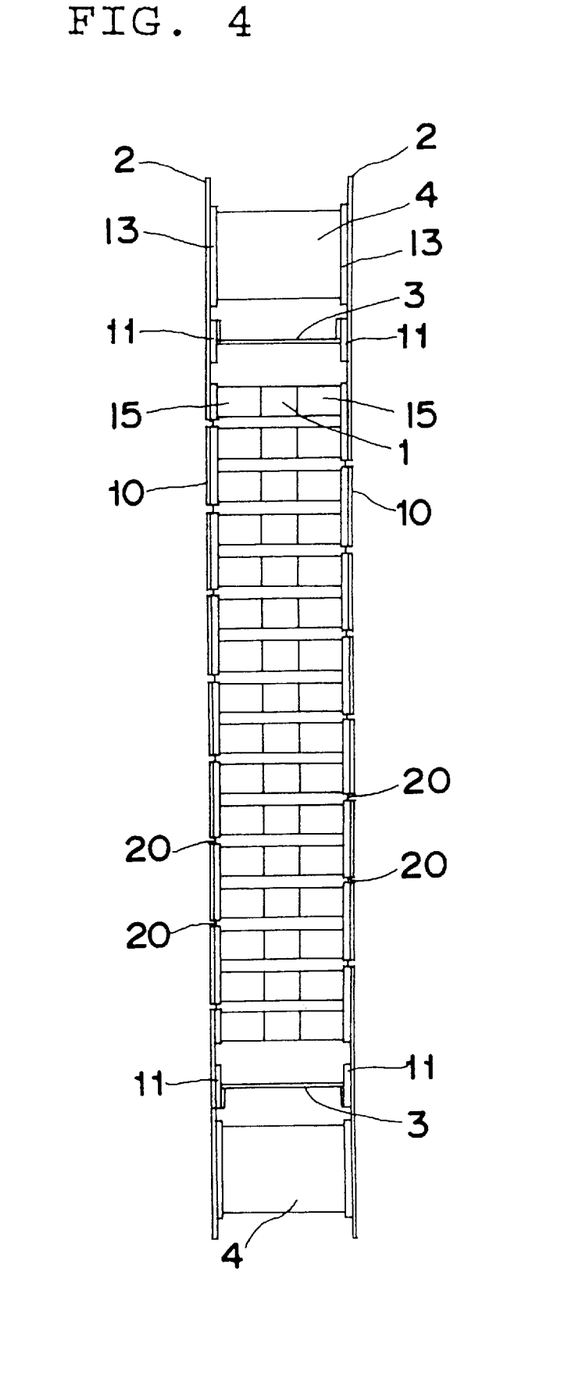
FIG. 4 is a cross section of the Peltier effect module according to the preferred embodiment of the present invention.

As shown in FIG. 1 and FIG. 3, a Peltier effect module according to the present invention includes a plurality of Peltier effect elements 1, a pair of substrates 2, a hollow seal frame 3, and cylindrical support pillars 4 disposed at four corners of the two substrates 2 to support and connect the substrates 2 together.

The Peltier effect elements 1 are formed in pairs of p and n elements serially connected in T-shaped pairs by plural connection electrodes 10 formed on the opposing substrates 2. As a result, pairs of p and n Peltier effect elements 1 are connected in series electrically, and in parallel thermally. Both ends of the series circuit thus formed by the Peltier effect elements 1 and connection electrodes 10 on the substrates 2 are formed on the opposing faces of the substrates 2, and are connected to a rectangular frame-shaped power supply lead 11, which comprises a terminal block 12 for connection with external devices.

Figure 5:
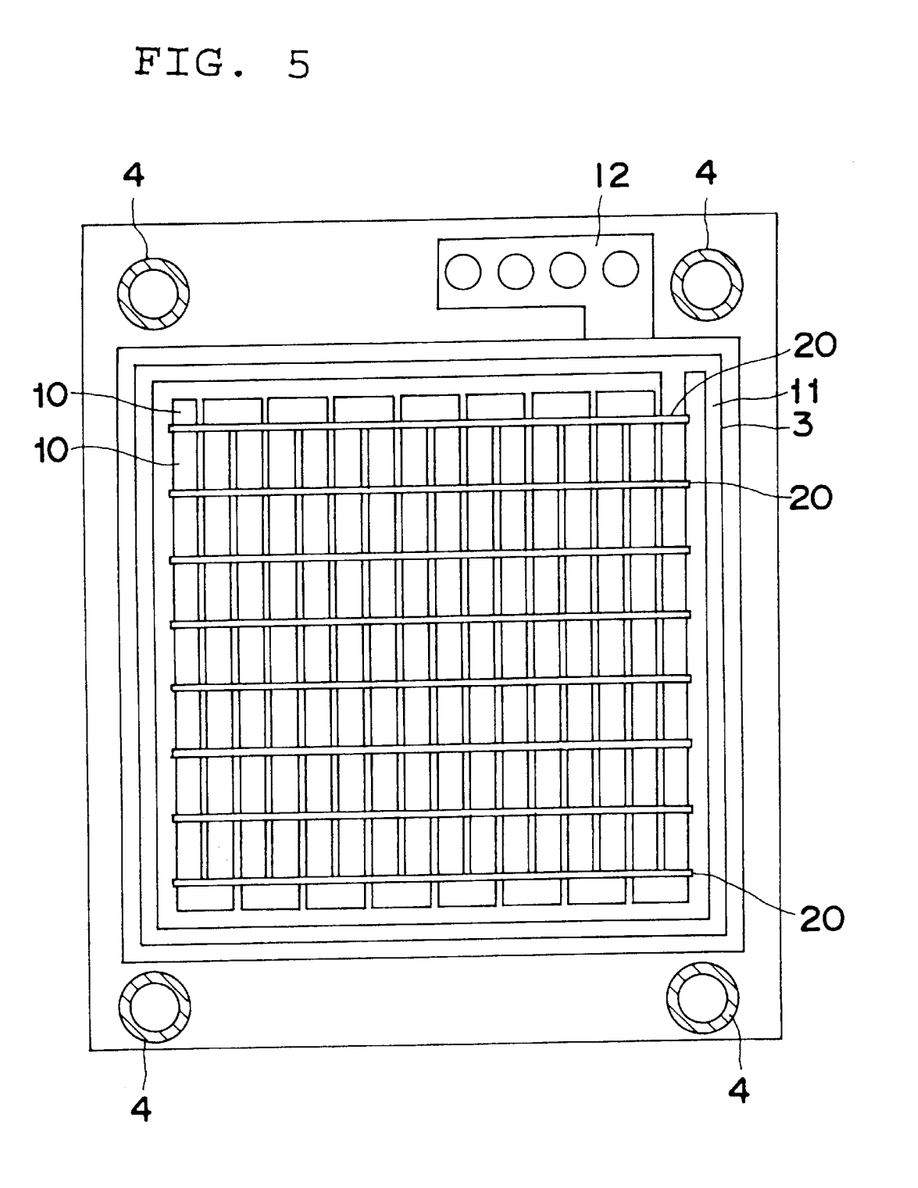
FIG. 5 is a cut-away frontal view of one substrate used in the Peltier effect module according to the preferred embodiment of the present invention.
Figure 6:
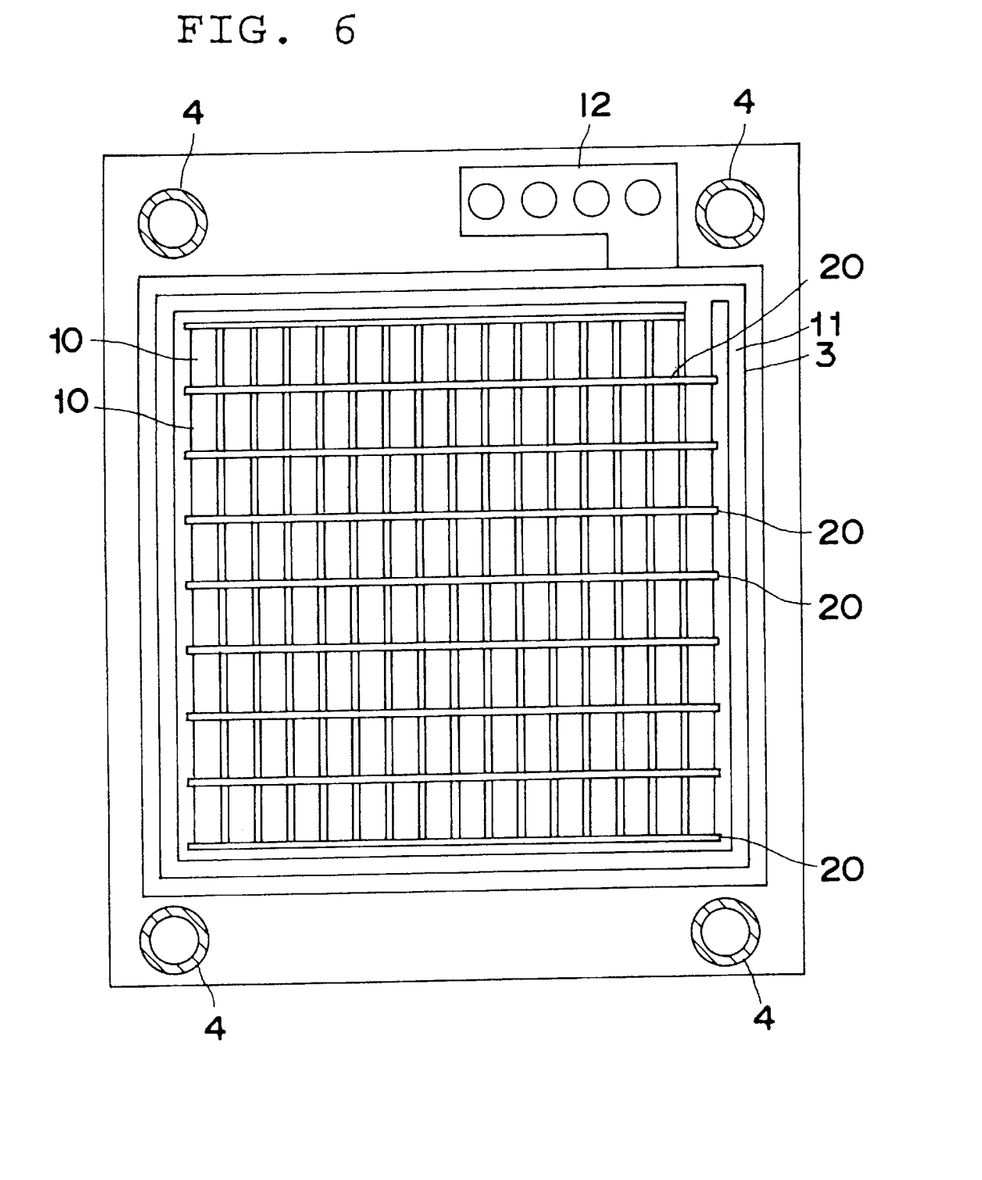
FIG. 6 is a cut-away frontal view of the other substrate used in the Peltier effect module according to the preferred embodiment of the present invention.

One of the substrates 2 is shown in FIG. 5, and the other in FIG. 6. The positions of the connection electrodes 10 for serially connecting the Peltier effect elements 1 are offset on each of the substrates 2. As will also be obvious from the figures, the power supply lead 11 provided on each of the substrates 2 is an annular member of a closed loop surrounding the area in which the connection electrodes 10 are disposed, i.e., surrounding the plural Peltier effect elements 1.

Figure 7:
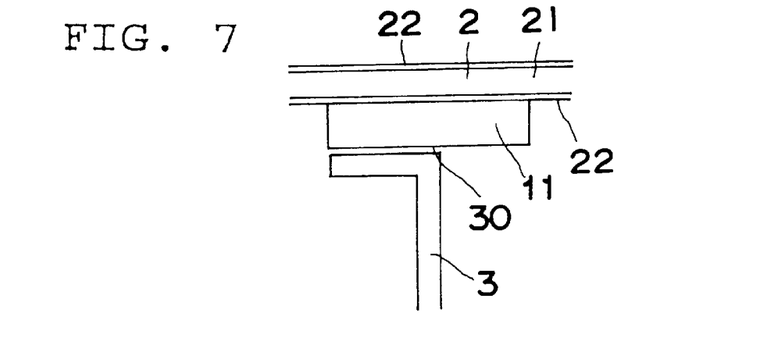
FIG. 7 is an enlarged cross section through one substrate of the Peltier effect module according to the preferred embodiment of the present invention.
Figure 8:
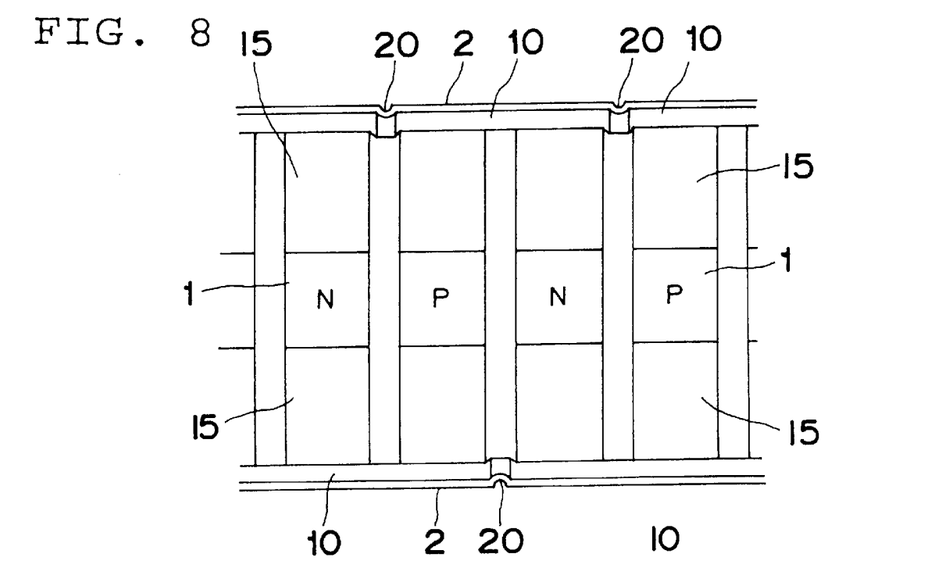
FIG. 8 is an enlarged cross section of the Peltier effect module according to the preferred embodiment of the present invention.
Figure 9:
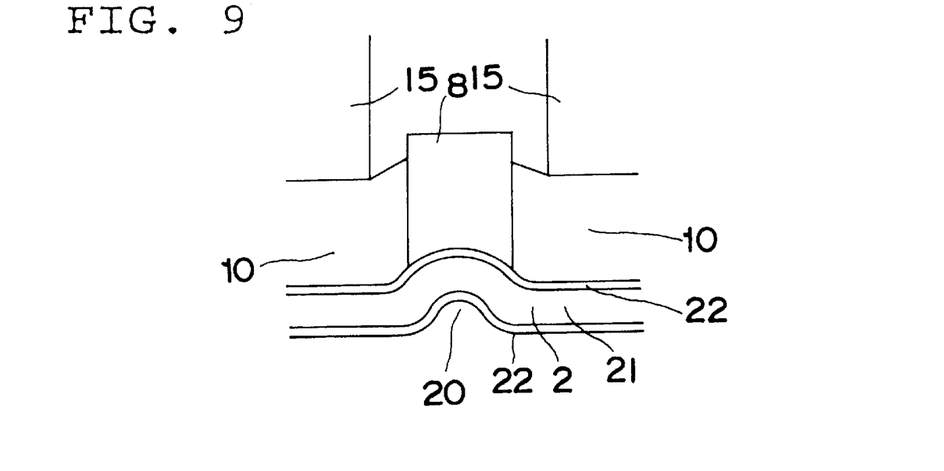
FIG. 9 is an enlarged cross section of the Peltier effect module according to the preferred embodiment of the present invention.

The substrates 2, at least the surfaces of which are electrically insulated, may be prepared from a sheet of alumina or aluminum nitride body, or a composite sheet of aluminum with an alumite coating, aluminum with an alumina or silicon dioxide coating, or copper with a thin adhesive insulation layer formed on the sheet surface. Considering the characteristics required in the substrates 2 and the ease of manufacturing the substrates 2 including a thermal stress absorber 20 described below, an aluminum sheet 21 coated with ceramic 22 such as alumina or silicon dioxide as shown in FIGS. 7 and 9 is preferable. This configuration also makes it simple to form the connection electrodes 10, power supply lead 11, terminal block 12, and other components on the surface of the substrates 2 using the known flame spray method.

The seal frame 3 is used to seal the area in which the Peltier effect elements 1 are arrayed, and may be formed to a cylindrical shape from ABS (i.e., acrylonitrile butadiene styrene resin) or another insulating material. Both open ends of this hollow cylinder are bonded to the closed loop part of the power supply leads 11 formed on each of the substrates 2 to form a moisture-proof seal enclosing the Peltier effect element array. The bond between the seal frame 3 and the power supply leads 11 is formed as shown in FIG. 7 by plating or flame-spraying a copper, nickel, tin, or other metallic thin film 30 on the parts of seal frame 3 that are bonded to the power supply leads 11. This metallic thin film 30 is then brazed or soldered to the power supply leads 11 to establish a metallic bond sealing the seal frame 3 with the power supply leads 11. This metallic bond makes it possible to avoid the use of an adhesive sealant which over the long term is susceptible to deterioration and, therefore, moisture penetration. It should be further noted that the seal frame 3 also functions to bear the compression load between the two substrates 2.

The cylindrical support pillars 4 may be manufactured, for example, from a fiber-filled plastic having low thermal conductivity with a copper, nickel, tin, or other metallic thin film coated or thermally sprayed to both ends thereof. Similarly to the seal frame 3, the ends of the support pillars 4 are then brazed or soldered to the metallic member 13 formed on the substrates 2 by the use of, for example, flame spraying. Note that these metallic members 13 are electrically insulated from the power supply leads 11.

The metallic members 13 may also be formed in the same process in which the connection electrodes 10 and power supply leads 11 are formed on the substrates 2, and the Peltier effect elements 1, seal frame 3, and support pillars 4 can be simultaneously bonded to the substrates 2. The assembly characteristics of the Peltier effect module according to the present invention are thus excellent.

The Peltier effect elements 1 are not directly bonded to the connection electrodes 10, but are indirectly bonded to the connection electrodes 10 through a buffer member 15 used to alleviate thermal stress. The buffer member 15 is made from a material with high electrical and thermal conductivity, and a Young's modulus substantially equal to that of the Peltier effect elements 1, e.g., a material such as annealed copper. Both ends of the Peltier effect elements 1 are first plated with a nontoxic metal, and the buffer member 15, which is coated with nickel, gold, solder, or any other plating, is soldered to both ends of the Peltier effect elements 1 to sandwich the Peltier effect elements 1 between pairs of buffer members 15. These Peltier effect elements 1 of a sandwich structure may be bonded to the connection electrodes 10 of the substrates 2 by soldering or a metallic paste. It should be noted that copper is used for buffer member 15 in this embodiment because of its high electrical and thermal conductivity and low cost, while annealing the copper lowers the Young's modulus of unannealed copper, which is high as compared with that of the Peltier effect elements 1, to approximately the same Young's modulus as the Peltier effect elements 1.

When buffer members 15 are disposed between the Peltier effect elements 1 and substrates 2, the effective Peltier effect element height can be increased while the Peltier effect element resistance is kept low. Thermal stress acting on the bond joints between the Peltier effect elements 1 and buffer members 15 can also be reduced because thermal stress acts on the integral Peltier effect elements 1 and buffer members 15. Loss from heat radiation can also be reduced and performance improved because the distance between the heating-side substrate 2 and the cooling-side substrate 2 is increased.

When soldering is used to bond the Peltier effect elements 1 and buffer members 15, and to bond the buffer members 15 and connection electrodes 10, the soldering temperature used to bond the buffer members 15 and connection electrodes 10 must be lower than the soldering temperature used to bond the Peltier effect elements 1 and buffer members 15. This is to prevent the solder bonding the Peltier effect elements 1 and buffer members 15 from melting again and reliability deteriorating when soldering the buffer members 15 bonded with the Peltier effect elements 1 to the connection electrodes 10 of the substrates 2. The soldering temperatures that will not adversely affect the performance of the Peltier effect elements 1 therefore preferably have a peak below 300° C. for soldering the Peltier effect elements to buffer members, and a peak below approximately 230° C. for soldering the buffer members to the connection electrodes.

A precious metal conductive paste that does not melt when heated is applied, and may also be used for the bonds between the Peltier effect elements 1 and buffer members 15, or the bonds between the buffer members 15 and connection electrodes 10. When the precious metal conductive paste is used to bond the Peltier effect elements 1 and buffer members 15, the Peltier effect element plating process is not necessary. It is also not necessary to consider the curing temperature during the assembly process when the precious metal conductive paste is used to bond the Peltier effect elements 1 and buffer members 15. Note, however, that if the Peltier effect elements 1 and buffer members 15 are soldered, and the precious metal conductive paste is used to subsequently bond the buffer members 15 and connection electrodes 10, the curing temperature of the precious metal conductive paste must be lower than the soldering temperature.

A preferred method of manufacturing the Peltier effect module will now be described.

Figure 16A:
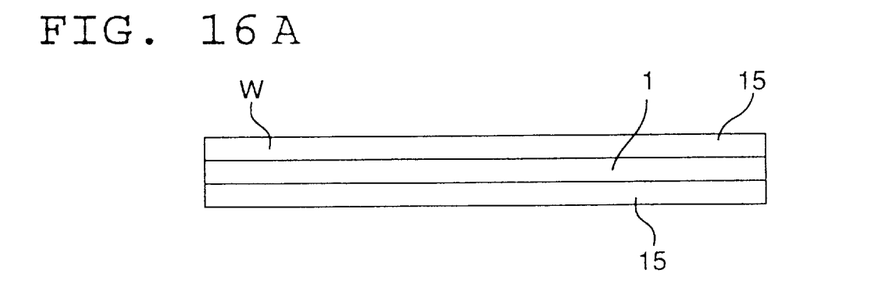
FIG. 16A simplified cross section used to describe the method of manufacturing the Peltier effect element.
Figure 16B:
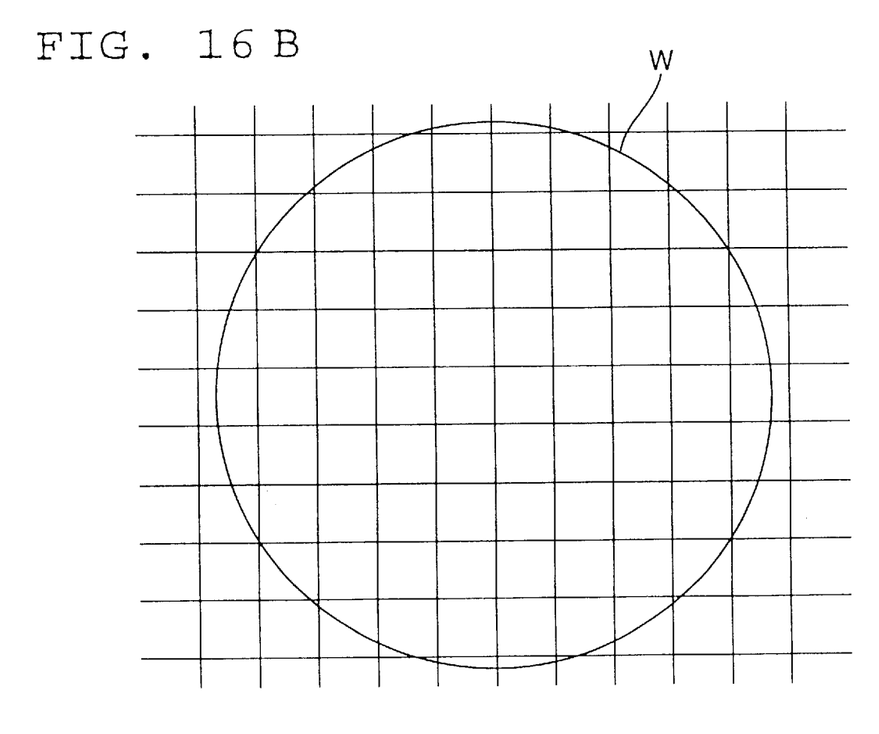
FIG. 16B is a simple plan view of the cutting lines used to manufacture the Peltier effect elements.

As will be obvious from the preceding description, the Peltier effect module is achieved by bonding the Peltier effect element sandwiches, each comprising a Peltier effect element 1 sandwiched between two buffer members 15, between two substrates 2. The Peltier effect element sandwiches, however, are not manufactured individually, but by dicing a wafer as shown in FIG. 16. More specifically, both sides of a Peltier effect element wafer are coated with a harmless metal before dicing, and thin sheets of the buffer member material 15 coated with a nickel, gold, solder, or other metallic coating are bonded by soldering or other means to the Peltier effect element wafer as shown in FIG. 16A, resulting in sandwich wafers w. The sandwich wafers w are then diced as shown in FIG. 16B to obtain the sandwich chips.

It should be noted that the cross sectional area of the buffer members 15 and the cross sectional area of the Peltier effect elements 1 are substantially equal in this sandwich structure to achieve the best thermal integration between the Peltier effect elements 1 and buffer members 15.

Each of the substrates 2 also comprises thermal stress absorbers 20 between the connection electrodes 10 and between the connection electrodes 10 and power supply lead 11. These thermal stress absorbers 20 are plural protrusions extending towards the opposing surface. Note that the connections between the power supply lead 11 and connection electrodes 10, and part of the connection electrodes 10, are disposed traversing the thermal stress absorbers 20. A heat exchange member is fastened by a bolt passing through the cylindrical support pillars 4 to the outside surface of each substrate 2.

When the substrates 2 are made from an aluminum sheet 21 with a ceramic layer 22 on the surface thereof as shown in FIG. 9, the thermal stress absorbers 20 can be formed by crimping the thin aluminum sheet 21 (which is typically 0.1 mm thick) in a die. The ceramic layer 22, connection electrodes 10, and power supply lead 11 are then formed after forming the thermal stress absorbers 20. The thermal stress absorbers 20 reduce the stress acting on the joints between the substrates 2 and Peltier effect elements 1 (buffer members 15) as a result of the thermal expansion and contraction of the substrates 2. Combined with the effect of the buffer members 15 reducing the stress acting directly on the Peltier effect elements 1, the thermal stress absorbers 20 and buffer members 15 effectively prevent thermal stress damage to the Peltier effect elements 1.

As shown in FIG. 9, part of the connection electrode 10 is formed over the protruding thermal stress absorber 20. If this protruding area is used to regulate the position of the Peltier effect elements 1 (with the integral buffer members 15), and the thermal stress absorbers 20 are also used as positioning members for the Peltier effect elements 1, alignment variations can be reduced during assembly, the insulation pitch between the Peltier effect elements 1 can be held constant, and the assembly characteristics and electrical characteristics can be improved. Note that a solder resist 8 or other insulating material is preferably used to thus form the connection electrodes 10 as shown in FIG. 9. The connection electrodes 10 and power supply lead 11 can be formed easily and precisely using thermal spray techniques. More specifically, any copper powder or other overspray from the thermal spray process adhering to areas other than the electrode zones can be easily removed, and the insulation of the electrodes can be assured.

Figure 10:
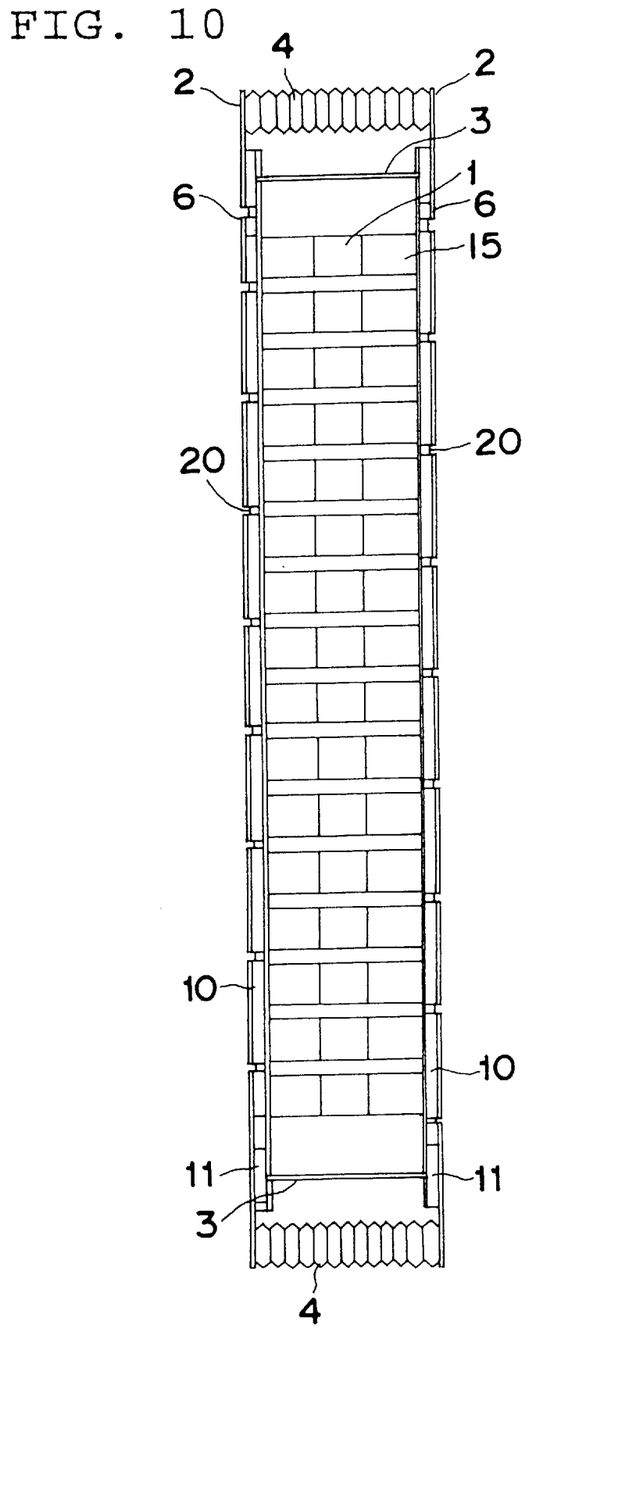
FIG. 10 is a cross section of an alternative embodiment of the Peltier effect module according to the present invention.
Figure 11A:
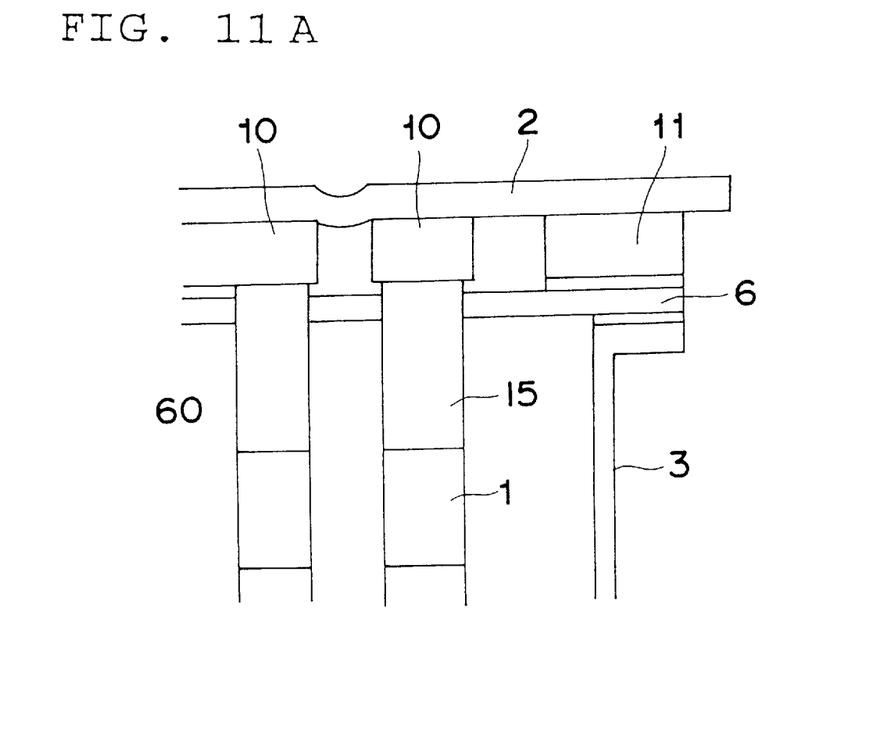
FIG. 11A is an enlarged cross section through one substrate of the Peltier effect module according to the alternative embodiment shown in FIG. 10.
Figure 11B:
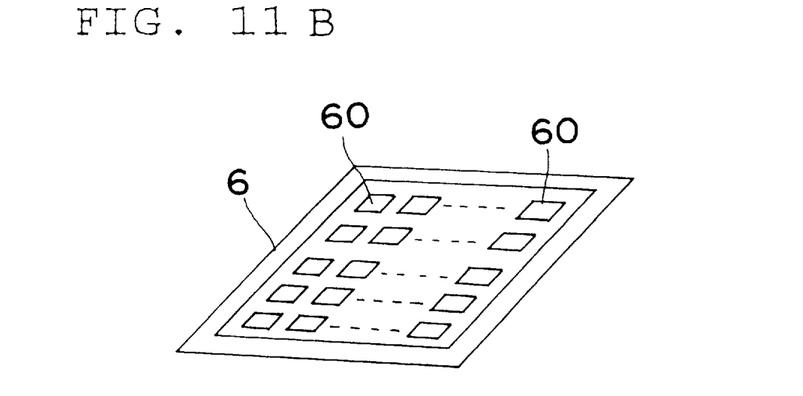
FIG. 11B is a perspective view of the positioning sheet.

In the embodiment shown in FIG. 10 and FIG. 11 positioning sheets 6 made from polyethylene, polystyrene, polypropylene, engineering plastic, or a similar material and having through-holes 60 for the Peltier effect elements 1 are disposed appropriately between the substrates 2. Note that using the positioning sheet 6 to position each of the Peltier effect elements 1 improves the assembly characteristics of the Peltier effect module while also restricting the movement of the Peltier effect elements I as a result of thermal stress or other factors. Note that the bellows-like support pillars 4 used in the embodiment shown in FIG. 10 also provide a shock buffering function.

Figure 12A:
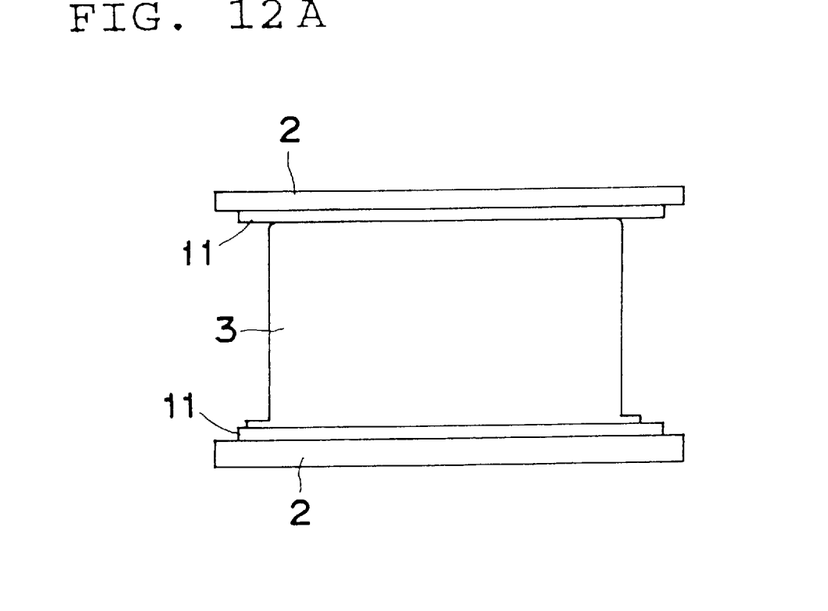
Figure 12B:
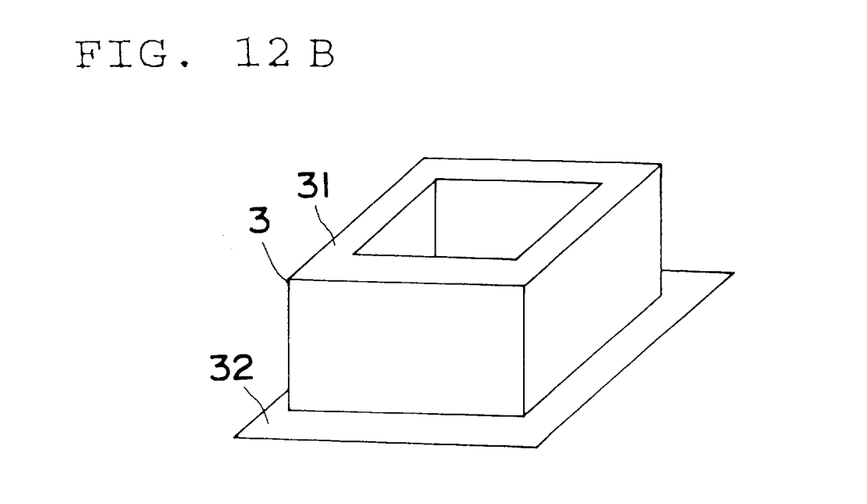
FIG. 12B is a perspective view of an alternative embodiment of the seal frame in the Peltier effect module according to the present invention.

As shown in FIG. 12, the hollow-body seal frame 3, is drawn from stainless steel sheet, forming an inside flange 31 on one end and an outside flange 32 on the other. Then stainless steel sheet is treated with an insulated coating with a layer of copper, nickel, tin, or other easy bonding metal formed by plating or flame spraying on the end lips of the seal frame 3 at the part used for bonding with the power supply lead 11. This metal coating makes it possible to create a metallic bond between the seal frame 3 and the power supply lead 11. With this configuration, the high mechanical strength of the seal frame 3 assures sufficient mechanical strength in the Peltier effect module even if the support pillars 4 are eliminated. This configuration can therefore also be used to reduce the size of the Peltier effect module due to the space savings achieved by eliminating the support pillars 4.

Figure 13:
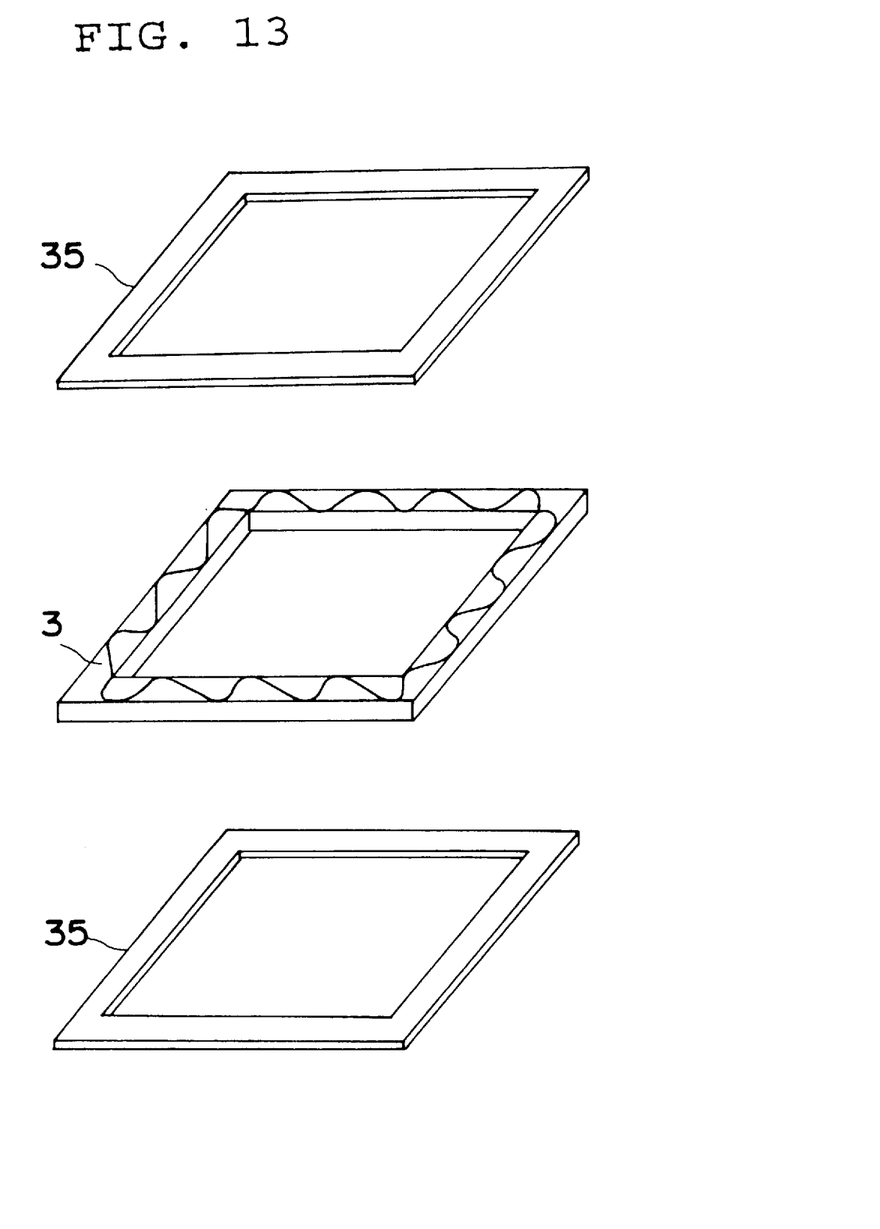
FIG. 13 is an exploded view of an alternative embodiment of the seal frame in the Peltier effect module according to the present invention.

As shown in FIG. 13, the seal frame 3 can also be manufactured from cardboard blanks treated with a waterproofing process such as varnishing, parylene, or with a low melt point glass. The treated seal frame 3 is then sandwiched between closed-loop thin copper plates 35 by an adhesive applied around the open edges. These copper plates 35 are used for bonding the seal frame 3 with the power supply lead 11.

It will be obvious, however, that the seal frame 3 of the present invention can be manufactured in various other ways insofar as the thermal resistance between the opposite ends of the seal frame 3 is high and said ends are electrically insulated from each other, and the seal frame 3 is manufactured from a moisture-proof material to prevent moisture penetration. The seal frame 3 will also preferably provide high mechanical strength.

Peltier effect elements 1 can also be crystal or sintered elements, though crystal elements are more efficient. Crystal Peltier effect elements 1 are preferably used if efficiency is a design objective, but the drawback to crystal devices is that they are brittle when exposed to mechanical stress. Sintered elements, on the other hand, provide comparatively lower efficiency, but are more durable when subject to mechanical stress than are crystal elements. By using a combination of crystal and sintered Peltier effect elements 1, however, a Peltier effect module in which mechanical loads are carried by sintered Peltier effect elements 1 and efficiency is improved by the crystal Peltier effect elements 1 can be achieved by using sintered Peltier effect elements 1 at the four corners and center areas, and crystal elements for the remaining Peltier effect elements 1. The Peltier effect module therefore offers both high mechanical load resistance and good operating efficiency. It is also possible to combine these characteristics with a compact module size for certain applications because load bearing strength may be sufficient even with the support pillars 4 eliminated.

Figure 14A:
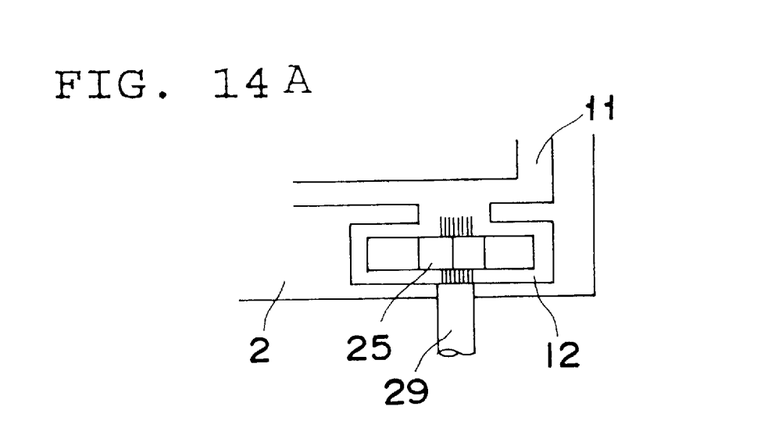
Figure 14B:
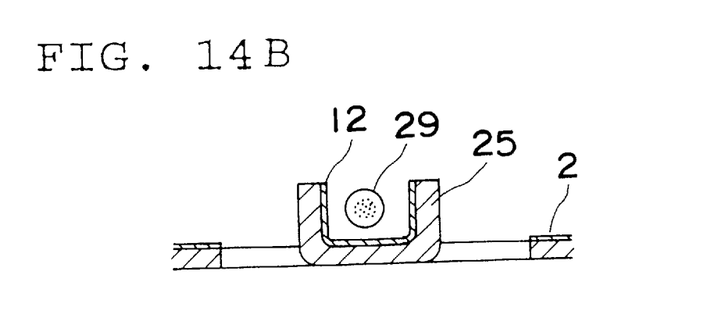
FIG. 14B is a cross section, of an alternative embodiment of the terminal block in the Peltier effect module according to the present invention.

It should be noted that the terminal block 12 of the power supply lead 11 is provided externally to the closed-loop seal frame 3 as a means of not degrading the moisture resistance of the Peltier effect module by providing the terminal block 12. The terminal block 12 is also an L-shaped member as shown in FIG. 5 and FIG. 6 to further increase the distance to the bond between the seal frame 3 and power supply lead 11, making it more difficult for the effects of the heat from soldering external to lead to the terminal block 12 from reaching the seal frame bond. As shown in FIG. 14, however, the terminal block 12 can be alternatively formed by stamping terminal clamp ends 25 into the substrate 2. External leads 29 can then be fastened to the terminal block 12 without soldering by crimping the terminal clamp ends 25 to the lead 29, eliminating the effects of solder heat and the need to increase the distance between the terminal block 12 and the bond between the seal frame 3 and power supply lead 11.

Figure 15:
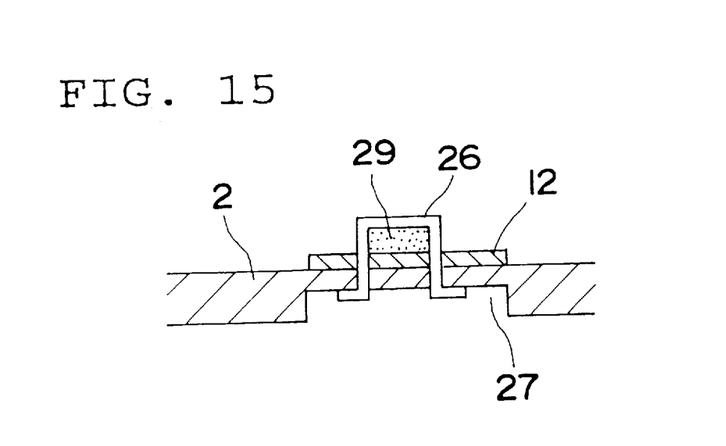
FIG. 15 is a cross section of an alternative embodiment of the terminal block in the Peltier effect module according to the present invention.

As shown in FIG. 15, lead 29 may also be fastened by means of a separate clamping member 26 passing through the substrate 2. Note that the recess 27 provided in the substrate 2 in the crimping zone of the clamping member 26 is to prevent; interference between the heat exchange member and the clamping member 26.

It should also be noted that while the metallic bonding method described above is the most effective seal frame fastening method, seal reliability can be further improved by coating the perimeter around the seal frame with an adhesive. The adhesive in this case is preferably a flexible epoxy adhesive such as Pelnox XM-2109/Pelcure XY-2110 manufactured by Nippon Pelnox Corporation. Two coats of the epoxy adhesive shall also be preferably applied for greater effectiveness. Use in combination with a butyl adhesive is also effective.

In addition to the materials described above for the seal frame, various coated resin moldings can also be used, including a liquid crystal polymer resin (product number C820) manufactured by Nippon Polyplastic K.K.; polyphthalamide resin (product number 1240L) manuf actured by Teijin Amoco K.K.; and epoxy resin (product number CV4100) manufactured by Matsushita Electric Works, Ltd. The specific material used shall be selected with consideration given to such factors as the heat resistance of the coating and solder.

Coating with $SiO_2$, e.g., polysilazane available from Tonen Co., after assembly is also effective.

Because the perimeter area around the Peltier effect elements between the substrates is not sealed with a sealant is or adhesive filler but rather by using a hollow seal frame bonded at both ends thereof to the substrates in a Peltier effect module according to the present invention as described above, the ability to prevent the penetration of water moisture is substantially determined by the material from which the seal frame is manufactured. It is therefore possible to reliably prevent the penetration of moisture to the Peltier effect module over the long tern by appropriately selecting the seal frame material, and greatly increase product life. It is also simple to prevent a drop in thermal performance, contribute to higher overall strength in the module, and improve shook resistance.

When a power supply lead electrode formed in a closed loop enclosing the connection electrode group is provided on each substrate with both open ends of the seal frame connected to said power supply lead, the use of adhesives with their incumbent moisture prevention problems can be eliminated, and high moisture resistance can therefore be achieved.

The seal frames can also be manufactured simply and at low cost when the seal frame is made from a plastic member with a metal coating formed at the connection with the power supply lead, and the overall module cost can therefore be reduced. When the seal frame is made from a drawn stainless steel plate with a metal coating formed at the connection with the power supply lead, module strength can be greatly improved. When the seal frame is made from a paper member treated with a waterproofing process, the seal frame can also be manufactured easily at a low cost, and the overall module cost can therefore be reduced.

When the Peltier effect module comprises an externally exposed terminal, the area from which the terminals are exposed can also be prevented from reducing moisture resistance by providing a terminal block for connection with external leads as part of the power supply lead on the substrate externally to the seal frame.

When the substrates are made from a shaped aluminum member treated with an alumina or silicon dioxide coating, and the connection electrodes and power supply lead are made with a flame spray method, substrates with the appropriate characteristics can be easily obtained. Mechanical strength can also be greatly improved if the pair of substrates are further supported outside the seal frame by plural support pillars.

It should be further noted that the inventors have confirmed that a product life approximately six times that of conventional Peltier effect modules can be achieved by using a copper pattern as the power supply lead 11, and coating the outside perimeter of the seal frame with an adhesive after bonding.

What is claimed is:

1. A Peltier effect module comprising:
    a pair of substrates arranged opposite to each other;
    connection electrodes formed on each opposed surface of the pair of substrates;
    a pair of power supply lead electrodes each formed in a closed loop and enclosing the connection electrodes on each opposed surface of the pair of substrates;
    plural Peltier effect elements arranged in parallel between the pair of substrates; and
    a hollow seal frame positioned between the pair of substrates to surround the plural Peltier effect elements, the seal frame having upper and lower ends for metallic bonding wherein the upper and lower ends of the seal frame are metallically bonded to respective power supply lead electrodes, thereby sealing each end of the seal frame and each substrate.

2. The Peltier effect module according to claim 1 wherein the hollow seal frame is made from a plastic member with a metal coating formed at the connection with the power supply lead.

3. The Peltier effect module according to claim 1 wherein the hollow seal frame is made from a drawn stainless steel plate with a metal coating formed at the connection with the power supply lead.

4. The Peltier effect module according to claim 1 wherein the hollow seal frame is made from a paper member treated with a waterproofing process.

5. The Peltier effect module according to claim 1, wherein each power supply lead electrode comprises a terminal block that connects to external leads on the substrate disposed externally of the seal frame.

6. The Peltier effect module according to claim 1 wherein the substrates are made from a shaped aluminum member treated with an alumina or silicon dioxide coating, and the connection electrodes and power supply lead electrodes are made by the use of a flame spray method.

7. The Peltier effect module according to claim 1 wherein the pair of substrates is further supported outside the seal frame by plural support pillars.

8. The Peltier effect module according to claim 1, wherein the substrate on which the connection electrodes are disposed comprises a thermal stress absorber disposed between the connections of the mounted Peltier effect element that deforms according to thermal stress.

9. The Peltier effect module according to claim 8 wherein the thermal stress absorber is a ridge member formed between the bonds of the Peltier effect elements.

10. The Peltier effect module according to claim 9 wherein the ridge members also function as positioning members for the Peltier effect elements.

11. The Peltier effect module according to claim 1 wherein the Peltier effect elements are connected to the substrates through a buffer member, said buffer member being used to alleviate thermal stress, and being made from a material with high electrical and thermal conductivity, and having a Young's modulus substantially equal to that of the Peltier effect elements.

12. The Peltier effect module according to claim 11 wherein the buffer member is made from annealed copper.

13. The Peltier effect module according to claim 11 wherein a soldering temperature used to bond the Peltier effect elements and buffer members is higher than the soldering temperature used to bond the buffer members to the substrates.

14. The Peltier effect module according to claim 11 wherein a precious metal conductive paste is used for the bonds between the Peltier effect elements and buffer members, or the bonds between the buffer members and substrates.

15. The manufacturing method for the Peltier effect module according to claim 1 wherein a buffer member used to alleviate thermal stress which is made from a material with high electrical and thermal conductivity, and a Young's modulus substantially equal to that of the Peltier effect elements, and is laminated to both surfaces of the Peltier effect element wafer, wherein the resulting lamellar body is then cut to form Peltier effect element chips with a buffer member bonded to both sides of the Peltier effect elements, wherein the Peltier effect element chips are arrayed between a pair of substrates, and wherein the substrates and buffer members of the Peltier effect element chips are then bonded together.

* * * * *